(12) United States Patent
Guillon et al.

(10) Patent No.: US 12,218,192 B2
(45) Date of Patent: Feb. 4, 2025

(54) METAL SUBSTRATE STRUCTURE FOR A SEMICONDUCTOR POWER MODULE

(71) Applicant: Hitachi Energy Ltd, Zürich (CH)

(72) Inventors: David Guillon, Vorderthal (CH); Harald Beyer, Lenzburg (CH); Roman Ehrbar, Zürich (CH)

(73) Assignee: Hitachi Energy Ltd, Zürich (CH)

( * ) Notice: Subject to any disclaimer, the term of this patent is extended or adjusted under 35 U.S.C. 154(b) by 227 days.

(21) Appl. No.: 17/705,980

(22) Filed: Mar. 28, 2022

(65) Prior Publication Data

US 2022/0344456 A1    Oct. 27, 2022

(30) Foreign Application Priority Data

Mar. 31, 2021 (EP) .................................. 21166412

(51) Int. Cl.
*H01L 29/06* (2006.01)
*H01L 29/66* (2006.01)

(52) U.S. Cl.
CPC .... *H01L 29/0649* (2013.01); *H01L 29/66037* (2013.01)

(58) Field of Classification Search
CPC ........... H01L 29/0649; H01L 29/66037; H01L 21/4853; H01L 21/4871; H05K 3/328; H05K 3/06; H05K 3/043; H05K 2201/10318; H05K 2203/0285
See application file for complete search history.

(56) References Cited

U.S. PATENT DOCUMENTS

| | | | |
|---|---|---|---|
| 9,673,118 B2* | 6/2017 | Taya | H01L 25/07 |
| 10,636,732 B2* | 4/2020 | Mohn | H05K 1/183 |
| 2004/0113258 A1 | 6/2004 | Yamada et al. | |
| 2008/0142571 A1 | 6/2008 | Yokozuka et al. | |
| 2010/0201002 A1 | 8/2010 | Hiramatsu et al. | |
| 2013/0084679 A1 | 4/2013 | Stolze et al. | |
| 2013/0221504 A1* | 8/2013 | Schulz | H01L 25/072 |
| | | | 228/110.1 |
| 2014/0034362 A1 | 2/2014 | Talon et al. | |
| 2015/0262962 A1 | 9/2015 | Matsumoto et al. | |
| 2016/0284638 A1 | 9/2016 | Tan | |
| 2017/0317008 A1* | 11/2017 | Momose | H01L 24/85 |
| 2020/0357731 A1 | 11/2020 | Hoehn | |
| 2022/0301957 A1 | 9/2022 | Takano | |
| 2022/0310409 A1* | 9/2022 | Arjmand | H01L 23/49811 |

FOREIGN PATENT DOCUMENTS

| | | |
|---|---|---|
| CN | 103035542 A | 4/2013 |
| CN | 104779220 A | 7/2015 |
| CN | 104798193 A | 7/2015 |
| CN | 110945651 A | 3/2020 |
| EP | 1160861 A2 | 12/2001 |
| EP | 1931183 A2 | 6/2008 |
| EP | 2219220 A2 | 8/2010 |

(Continued)

*Primary Examiner* — Dao H Nguyen

(74) *Attorney, Agent, or Firm* — Slater Matsil, LLP

(57) ABSTRACT

A method can be used for manufacturing a metal substrate structure for a semiconductor power module. A plurality of terminals are welded to a metal top layer. After the welding, a dielectric layer is coupled between the metal top layer and a metal bottom layer. The dielectric can be laminated or molded, as examples.

21 Claims, 9 Drawing Sheets

(56) References Cited

FOREIGN PATENT DOCUMENTS

| | | | |
|---|---|---|---|
| JP | 2003198077 | A | 7/2003 |
| JP | 2003264354 | A | 9/2003 |
| JP | 2008141058 | A | 6/2008 |
| JP | 2012151198 | A | 8/2012 |
| JP | 2015144169 | A | 8/2015 |
| JP | 2017069521 | A | 4/2017 |
| JP | 2018190930 | A | 11/2018 |
| JP | 2019169605 | A | 10/2019 |
| JP | 7001186 | B1 | 1/2022 |
| WO | 2009011077 | A1 | 1/2009 |
| WO | 2019011654 | A1 | 1/2019 |

\* cited by examiner

METAL SUBSTRATE STRUCTURE FOR A SEMICONDUCTOR POWER MODULE

CROSS-REFERENCE TO RELATED APPLICATIONS

This application claims the benefit of European Patent Application No. 21166412.3, filed on Mar. 31, 2021, which application is hereby incorporated herein by reference.

TECHNICAL FIELD

The present disclosure is related to a metal substrate structure for a semiconductor power module and a semiconductor power module for a semiconductor device.

BACKGROUND

Conventional insulated metal substrates form technology for low and medium power semiconductor packages with low insulation requirements and low thermal resistance requirements simultaneously. Terminals are prepared on the insulated metal substrate.

Embodiments of the present disclosure can provide a cost saving metal substrate structure for a semiconductor power module that enables reliable functioning even for high voltage power module applications. Further embodiments of the present disclosure can provide a corresponding semiconductor power module for a semiconductor device and a manufacturing method for such a metal substrate structure.

SUMMARY

The present disclosure is related to a metal substrate structure for a semiconductor power module and a semiconductor power module for a semiconductor device. The present disclosure is further related to a corresponding manufacturing method for a metal substrate structure.

In one embodiment, a metal substrate structure for a semiconductor power module comprises a metal top layer having at least one recess, at least one terminal coupled with the metal top layer by means of welding, and a metal bottom layer. A dielectric layer is coupled with both the metal top layer and the metal bottom layer and is formed by means of molding between the metal top layer and the metal bottom layer.

In another embodiment, a method for manufacturing a metal substrate structure for a semiconductor power module comprises providing at least one terminal, a metal top layer, a dielectric layer, and a metal bottom layer. The at least one terminal is coupled with the metal top layer by means of welding and the metal top layer is coupled with the dielectric layer and with the metal bottom layer such that the dielectric layer is coupled with both the metal top layer and the metal bottom layer in between. The coupling of the at least one terminal with the metal top layer is done beforehand to the coupling of the metal top layer with the dielectric layer and the metal bottom layer.

Additional embodiments and variations are disclosed below.

BRIEF DESCRIPTION OF THE DRAWINGS

Exemplary embodiments are explained in the following with the aid of schematic drawings and reference numbers. The figures show.

DETAILED DESCRIPTION OF ILLUSTRATIVE EMBODIMENTS

Figure 1:
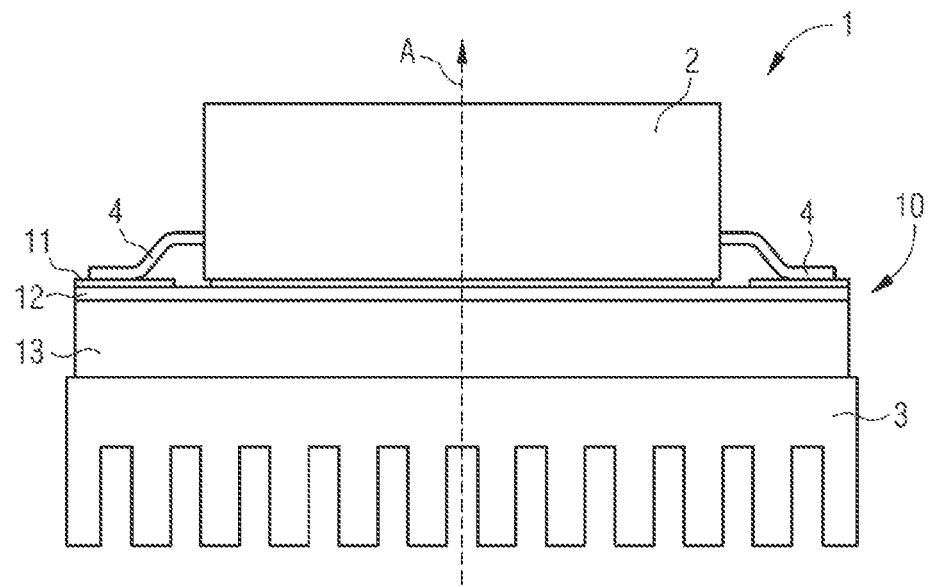
FIG. 1 embodiment of a semiconductor power module.

Embodiments of the invention will be described and specific examples will then be described with respect to the drawings.

According to an embodiment, a method for manufacturing a metal substrate structure for a semiconductor power module comprises providing at least one terminal, providing a metal top layer, providing a dielectric layer and providing a metal bottom layer. The method further comprises coupling the at least one terminal with the metal top layer by means of welding, for example by means of ultrasonic welding and/or laser welding. Other welding processes are possible as well. The method further comprises coupling the metal top layer with the dielectric layer and with the metal bottom layer such that the dielectric layer is coupled with both the metal top layer and the metal bottom layer in between, wherein the coupling of the at least one terminal with the metal top layer is done beforehand to the coupling of the metal top layer with the dielectric layer and the metal bottom layer.

Due to the described manufacturing method realization of welded joining connections on an insulated metal substrate are possible which can contribute to a stable and reliable functioning of a semiconductor power module even for high voltage power module applications. The welding connection of the terminal and the metal top layer is done and then the metal top layer is coupled with the dielectric layer and/or the metal bottom layer. In other words, the coupling of the metal top layer with the dielectric layer and/or the metal bottom layer is processed afterwards to the coupling of the terminal with the metal top layer by means of welding. Thus, mechanical stress due to welding is kept away from the dielectric layer and contributes to avoid cracks or other damages of the dielectric layer.

It is a recognition in connection with the present disclosure that conventional insulated metal substrates realize technologies for low and medium power semiconductor packages with low insulation requirements and low thermal resistance requirements simultaneously. For low reliability requirements, terminals can be e.g. soldered on substrate. Usually, welding provides better reliability, but a welding process can be critical for the substrate structure. In view of conventional setups of such insulated metal substrates corresponding terminals are connected to a top metallization using welding techniques to provide typically joining connections which can be critical with respect to a stable process on the substrates and a resin isolation sheet below the metallization. The welding process can lead to damages of the substrate structure and especially ultrasonic welding provides a strong impact of thermal and mechanical stress combined with heat on the substrate structure due to friction and pressure between a terminal foot and the substrate. Here a resin sheet is strongly endangered by deformation and crack formation. Corresponding failure modes must be considered when applying ultrasonic welding of terminal feet on a circuit metallization of an insulated metal substrate. Nevertheless, a high risk of a substrate damage is also available, if alternative welding methods would be used on such insulated metal substrates. Thus, a strong thermal impact must be considered as well, when joining terminal feet to substrates by laser welding, for example.

Due to conventional manufacturing of such metal substrate structures, for example using ultrasonic welding, generation of severe damages in an isolating sheet of an insulating layer during the welding process can occur. After ultrasonic welding of main and/or auxiliary terminals on the circuit metallization of the top layer a complete delamination between the top layer and the isolating layer can occur. Deformation a resin sheet or isolating material can be further adhered to the delaminated metal sheet on the terminal positions resulting in the formation of conchoidal cracks also in the isolating sheet of an insulated metal substrate.

By use of the described method for manufacturing a metal substrate structure it is possible to counteract the aforementioned adverse effects due to the separated welding process which is done beforehand and spaced apart from the coupling of the metal top layer and the dielectric layer. Thus, a risk of crack or damage formation can be completely suppressed and a stable semiconductor power module is feasible that enables reliable functioning even for high voltage power module applications in a voltage range of 0.5 kV up to 10.0 kV, for example. The one or more terminals can be welded directly onto a surface of the metal top layer to form a direct copper-to-copper contact, for example. Alternatively, solder or other materials such as a glue, a paint and/or varnish layer can be located between a bottom surface of the terminal and an upper surface of the metal top layer facing each other.

According to an embodiment of the method the step of coupling the metal top layer with the dielectric layer and with the metal bottom layer comprises aligning the metal top layer, the dielectric layer and the metal bottom layer relative to each other. The method further comprises laminating the metal top layer, the dielectric layer and the metal bottom layer.

Alternatively, the step of coupling the metal top layer with the dielectric layer and with the metal bottom layer comprises providing a molding substance, aligning the metal top layer and the metal bottom layer relative to each other with a predetermined distance in between, and then bringing in the provided molding substance between the aligned metal top layer and the metal bottom layer and thereby forming the dielectric layer by means of molding. The formation of the dielectric layer by means of molding can be done by injection molding, compression molding and/or transfer molding, for example.

Thus, the dielectric layer can realize a pre-preg sheet which is assembled between two metal plates on top and the bottom forming the metal top layer and the metal bottom layer. Such metallization sheets or plates are bonded to the insulation of the dielectric layer by the lamination process, for example. A required metallization structure of the metal top layer can then be done by subsequent steps of masking and etching processes to locally remove conductive metal, creating the final metallization structure.

With respect to a molded dielectric layer, the molding substance realizes a pumpable (able to be pumped) substance with predetermined material properties. The pumpable substance is a liquid or viscous raw material of the dielectric layer to be formed. For example, the molding substance is an epoxy and/or ceramic based liquid. Alternatively or additionally, the raw material of the dielectric layer may be a thermosetting or a thermoplastic resin material such as polyamide, PBT, PET. Alternatively or additionally, the raw material of the dielectric layer may comprise inorganic filler for improved thermal conductivity and/or CTE adjustment with respect to the metal top layer and/or the metal bottom layer. For example, the molded dielectric layer comprises a resin based dielectric material with ceramic filling material, e.g. epoxy, $Al_2O_3$, AlN, BN, $Si_3N_4$ or $SiO_2$. For example, the dielectric layer is an epoxy with filler. The dielectric layer can be also based on other materials suitable for transfer, injection or compression molding such as bismaleimide, cyanate ester, polyimide and/or silicones. Alternatively or additionally, the dielectric layer can include a ceramic material and/or hydroset material or a material combination of two or more of the aforementioned components.

The aligning of the metal top layer and the metal bottom layer relative to each other with a predetermined distance in between will substantially predetermine the later thickness of the molded dielectric layer. For example, the alignment can be realized by placing the metal top layer onto a release film or liner or another fixation, for example in a mold chase of a molding tool. This enables to precisely position the provided metallization structure of the metal top layer relative to the metal bottom layer and can be useful if the metal top layer comprises separate metal pads due to different potentials of operation, for example. In case of lamination, a thickness of a resin layer is given by the thickness and the behavior of the laminated layer.

According to a further embodiment of the manufacturing method the metal top layer can be provided with at least one recess by means of stamping. In view of a stamped metal top layer, the coupling of the at least one terminal with the metal top layer by means of welding can done beforehand or subsequent to the stamping of the metal top layer.

Alternatively or additionally, the metal top layer can be provided with at least one recess by means of etching and/or cutting, for example. Alternatively or additionally, the metal top layer is formed with a predetermined structure by means of laser cutting of a provided metal sheet, for example.

The metallization of the metal top layer can be formed out of a film and/or a sheet comprising copper and/or aluminum and/or an alloy of copper and/or aluminum. This can also apply to the metal bottom layer which can be formed as a copper and/or aluminum plate, for example. The at least one recess can realize a penetrating opening through a coherent piece of metal forming the metallization of the metal top layer. Alternatively, the at least one recess forms a groove or a free volume between two separate metal paths, for example. The metal top layer can also comprise a plurality of recesses and/or grooves to form a predetermined metal pattern to prepare a desired metallization on the top of the metal substrate structure. This can also imply multiple separated metal pattern on a top surface of the metal substrate structure.

The method of manufacturing the metal substrate structure can further comprise cleaning and/or levelling of the coupled terminal, the metal top layer, the dielectric layer and/or the metal bottom layer.

Moreover, according to a further embodiment electronic is provided and coupled with the at least one terminal to form a semiconductor power module, for example.

According to an embodiment, a metal substrate structure for a semiconductor power module comprises a metal top layer having at least one recess and at least one terminal which is coupled with the metal top layer by means of welding. The metal substrate structure further comprises a metal bottom layer and a dielectric layer which is coupled with both the metal top layer and the metal bottom layer and which is formed by means of molding between the metal top layer and the metal bottom layer. For example, the metal top layer including the at least one recess is formed by means of stamping and wherein the dielectric layer is molded such that it extends into the at least one recess. Additionally, the dielectric layer can be molded such that it forms a ditch or trench in the at least one recess. Alternatively, the dielectric layer is molded such that it forms an elevated portion or a barrier extending through the at least one recess protruding above an outer surface of the metal top layer.

According to an embodiment, a semiconductor power module for a semiconductor device comprises an embodiment of the described metal substrate structure and electronics which is coupled with the at least one terminal of the metal substrate structure. The semiconductor power module can further comprise a heat sink which is coupled with the metal bottom layer of the metal substrate structure to dissipate heat during operation of the semiconductor power module. Thus, the semiconductor power module can comprise a separate heat sink. Alternatively or additionally, the metal bottom layer of the metal substrate structure can act as a heat sink itself and can be configured to comprise ribs or protrusion, for example, to provide a beneficial heat dissipation. The metal bottom layer can further act as a baseplate of the semiconductor power module. The semiconductor power module including the metal substrate structure can be further partly or completely encapsulated by resin prepared by molding or potting or dielectric gel. Terminals may act as power terminals or as auxiliary terminals, e.g. used for signal wiring.

Moreover, the semiconductor power module can comprise two or more embodiments of the aforementioned metal substrate structure. The electronics may include chips, integrated circuits and/or other devices discrete devices.

The accompanying figures are included to provide a further understanding. It is to be understood that the embodiments shown in the figures are illustrative representations and are not necessarily drawn to scale. Identical reference numbers designate elements or components with identical functions. In so far as elements or components correspond to one another in terms of their function in different figures, the description thereof is not repeated for each of the following figures. For the sake of clarity elements might not appear with corresponding reference symbols in all figures possibly.

FIG. 1 illustrates a side view of an embodiment of a semiconductor power module 1 for a semiconductor device. The semiconductor power module 1 comprises a metal substrate structure 10, electronics 2 which is coupled with the metal substrate structure 10, and a heat sink 3 which is coupled with the metal substrate structure 10 as well. The electronics 2 can include chips, for example, and FIG. 1 is showing the semiconductor power module 1 with chips on the metal substrate structure 10. With respect to an illustrated stacking direction A the electronics 2 are coupled with a metal top layer 11 and the heat sink 3 is coupled with a metal bottom layer 13 of the metal substrate structure 10. The metal substrate structure 10 further comprises a dielectric layer 12 formed between the metal top layer 11 and the metal bottom layer 13.

Both, the metal top layer 11 and the metal bottom layer 13 consist of metal or at least comprise metal such as copper and/or aluminum, for example. Alternative thermally and/or electrically conductive materials or material combinations can be used instead. The dielectric layer 12 is pre-preg sheet or a molded epoxy with filler, for example. The filler can be ceramic like or realized by other inorganic filler like glass fibers. Alternatively or additionally, the dielectric layer 12 can comprise thermoplastic or thermosetting resin such as polyamide, PBT and/or PET. Alternatively or additionally, the dielectric layer 12 comprises a ceramic based insulation layer such as $Al_2O_3$, AlN, BN, $Si_3N_4$, and $SiO_2$. The dielectric layer 12 can also be based on other materials suitable for injection molding, transfer molding and/or compression molding such as bismaleimide, cyanate ester, polyimide and silicones, or might be even based on ceramic materials, such as hydroset materials. Thus, the metal substrate structure 10 realizes an insulated metal substrate with a structured topside metallization, a metal back side plate and a dielectric insulation layer in between. Pads of the metal top layer 11 are connected to components of the electronics 2 via leads 4 and/or via terminals 15 which are coupled with the metal top layer 11 by means of welding.

The illustrated semiconductor power module 1 can realize a gel-filled power module, wherein the electronics 2 or even the whole top side or even more of the metal substrate structure 10 can be embedded in or covered by an epoxy and/or gel encapsulation. Such an encapsulation can be done by means of molding afterwards to the manufacturing of the metal substrate structure 10, for example. Options of preparation of the semiconductor power module 1 can comprise filling with a gel, filling with N epoxy resin like potting resin, transfer molding and/or other molding methods.

Figure 2:
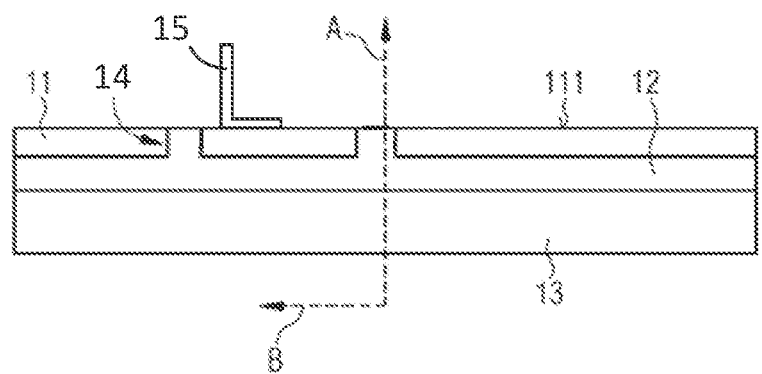
FIGS. 2-3 embodiments of a metal substrate structure for the semiconductor power module.
Figure 3:
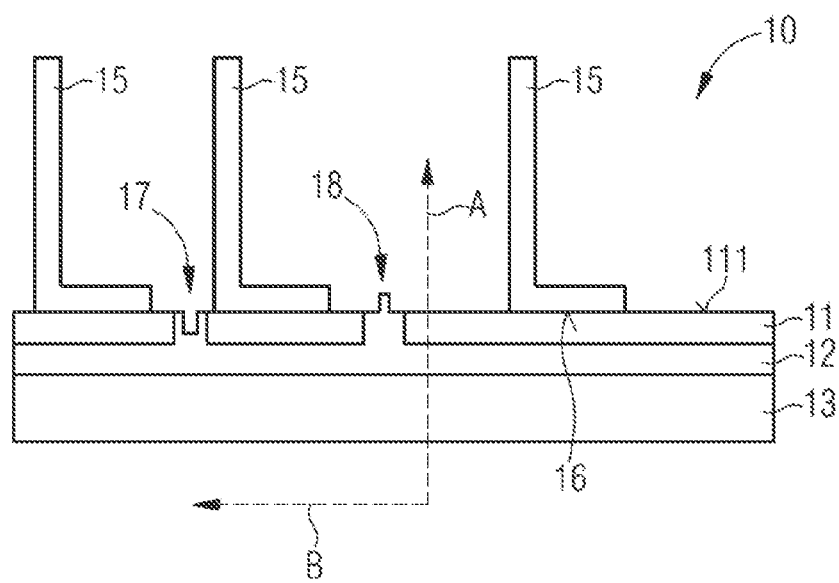

FIGS. 2-3 show two different embodiments of the metal substrate structure 10 in schematic side views. FIG. 2 illustrates the metal substrate structure 10 comprising the metal top layer 11 including two penetrating recesses 14 which are filled with material of the dielectric layer 12 in a predetermined manner, formed by means of molding for example. Thus, the dielectric layer 12 is molded such that it extends into the recesses 14 and covers edges of the metal top layer 11 which limit the recesses 14, respectively.

According to the embodiment shown in FIG. 3, the dielectric layer 12 can be molded such that there is a dielectric ditch 17 formed in one recess 14 and a dielectric barrier 18 formed in the other recess 14. The barrier 18 extends through the corresponding recess 14 and protrudes above an outer surface 111 of the metal top layer 11. The protrusion of the barrier 18 can be named as a rib. The ditch 17 and the barrier 18 are integrally formed with the dielectric layer 12 in one molding process for example and their limiting dielectric material can cover edges of the metal top layer 11 which limit the corresponding recesses 14.

The one or more terminals 15 can be welded directly onto the metallization of the metal top layer 11 to form a direct conductive contact, for example. Thus, a respective contact surface 16 of a terminal 15 directly contacts the outer surface 111 of the metal top layer 11. Alternatively, a solder or another material such as a glue, a paint and/or a varnish layer can be located between the contact surface 16 of the terminal 15 and the outer surface 111 of the metal top layer 11 facing each other. In this respect, soldering, sintering and/or gluing can be implemented in the manufacturing process.

The terminals 15 are coupled with the metal top layer 11 by means of welding, for example by means of ultrasonic welding and/or laser welding. Other welding processes are possible as well. The coupling of the terminals 15 with the metal top layer 11 is done beforehand to a coupling of the metal top layer 11 with the dielectric layer 12 and/or the metal bottom layer 13.

Figure 4:
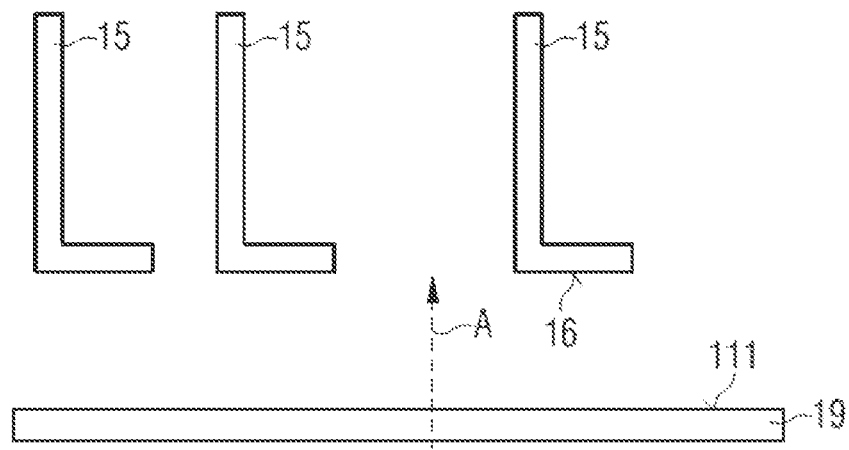
FIGS. 4-7 steps of manufacturing embodiments of the metal substrate structure for the semiconductor power module.
Figure 4:
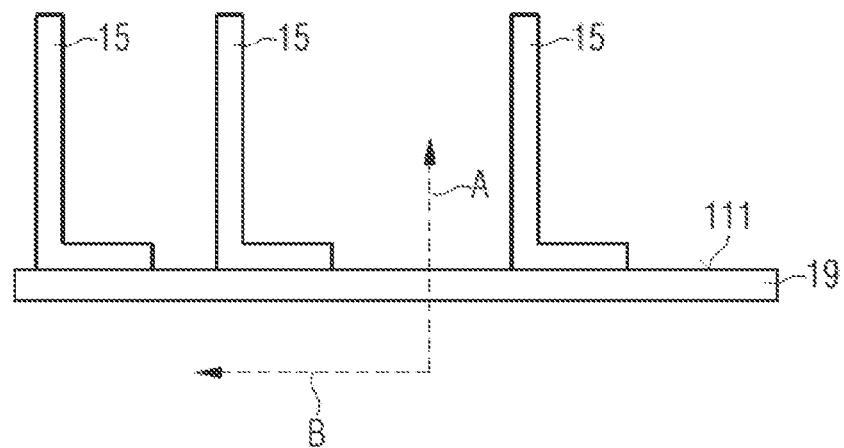
Figure 5:
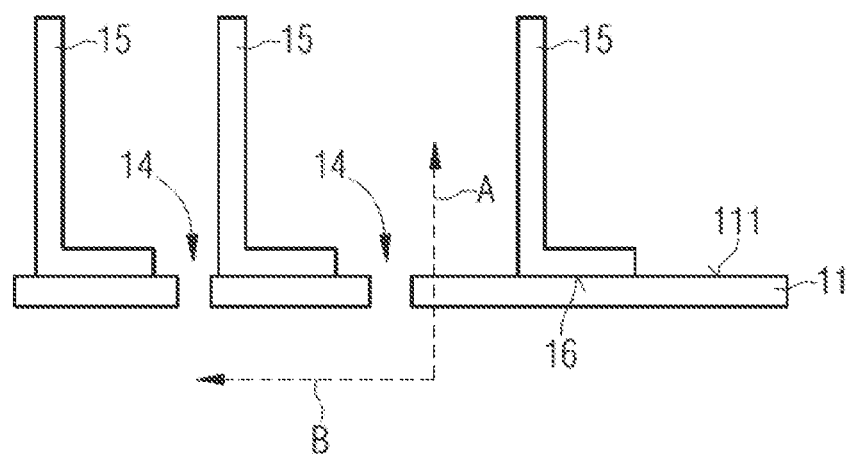
Figure 5:
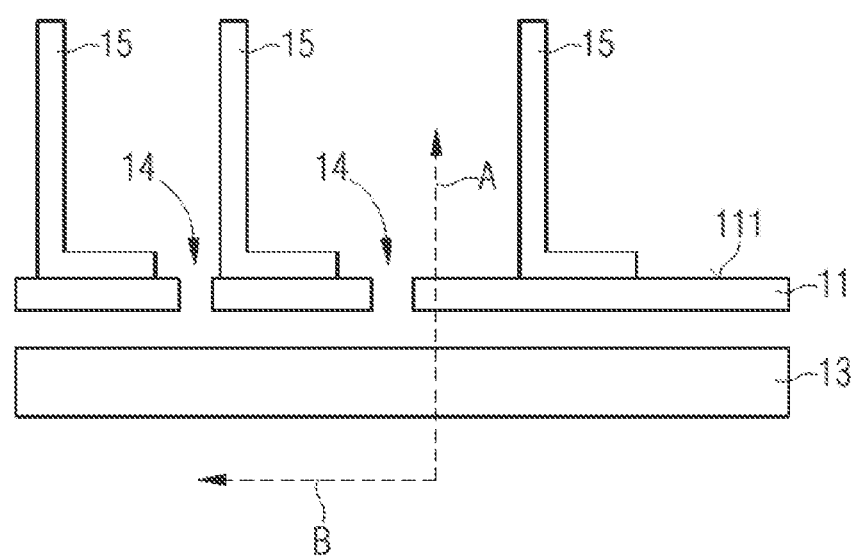
Figure 6:
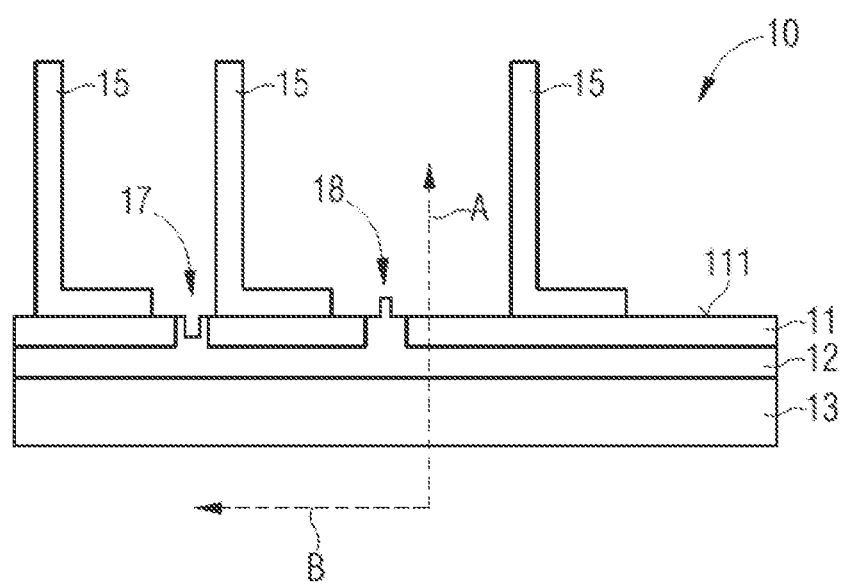

FIGS. 4 to 6 illustrate different manufacturing states of a method for manufacturing an embodiment of the metal substrate structure 10 according to FIG. 3, for example.

Figure 10:
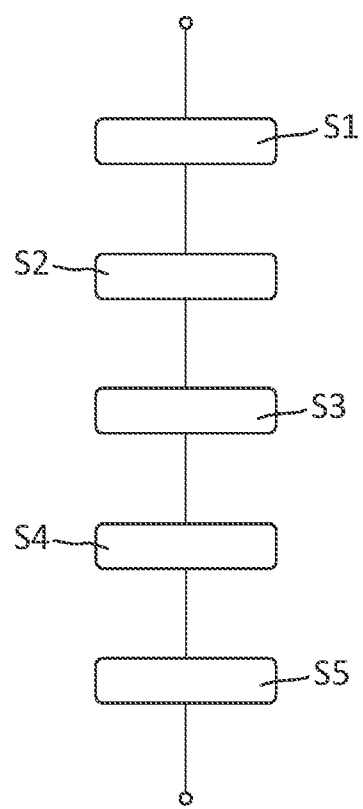
FIG. 10 flow chart for a method of manufacturing an embodiment of the metal substrate structure.

Steps of the corresponding manufacturing method can follow the flow chart as shown in FIG. 10.

In a step S1 a raw sheet 19 is provided to form the later metal top layer 11 (see upper part of FIG. 4). Moreover, three terminals 15 are provided each comprising an L-shape with respect to a cross section spanned by the stacking direction A and a lateral direction B. Of course, different shapes of the terminals 15 are possible as well.

In a step S2 the terminals 15 are welded onto the outer surface 111 of the metal top layer 11 (see lower part of FIG. 4). The welding can be done in terms of ultrasonic welding and/or laser welding, for example.

In a step S3 the raw sheet 19 is stamped using a stamping tool with protrusions prepared to form recesses 14 and the metal top layer 11 with predetermined metallization structure, for example (see upper part of FIG. 5). Alternatively, separate metal pads can be stamped out beforehand to the welding of the terminals 15 onto the metal top layer 11 (see FIG. 7). Other methods of separation like etching, cutting or laser cutting are possible as well.

In a step S4 the metal bottom layer 13 can be provided as well as a pumpable molding substance with predetermined material properties which realizes the liquid or viscous raw material to form the later dielectric layer 12. Moreover, in Step S4 the stamped metal top layer 11 with the welded terminals 15 on it and the provided metal bottom layer 13 are aligned relative to each other with a predetermined distance in between (see lower part of FIG. 5). This can be done by using a release film for fixation is a molding tool, for example, wherein the provided metallization structure of the metal top layer 11 is assembled onto. Afterwards, such a metal top layer release film unit can be positioned relatively to the provided metal bottom layer 13, for example, wherein the metal top layer 11 faces the metal bottom layer 13.

In a step S5 the provided molding substance is brought in into the free volume between the aligned metal top layer 11 and the metal bottom layer 13 and thereby molding of the dielectric layer 12 is processed. Formation of the dielectric layer 12 can be done by injection molding, transfer molding and/or compression molding and may include the formation of one or more ditches 17 and/or barriers 18 extending in and/or through a corresponding recess 14. For example, this is done by providing respective cavities limited by the molding tool and the metal top layer 11 in the region of the recesses 14. The provided substance is then brought into such cavities to form a trench, ditch 17, barrier 18 and/or rib. For preparation of ditches, the molding tool has corresponding protrusions, for example.

Thus, an embodiment of the metal substrate structure 10 for the semiconductor power module 1 can be manufactured consisting of a stamped metal plate topside realizing the metal top layer 11, an epoxy based molded insulation realizing the dielectric layer 12 and a metal plate bottom side realizing the metal bottom layer 13. Alternatively, etching of a homogeneous top metallization may be done after molding.

Figure 7:
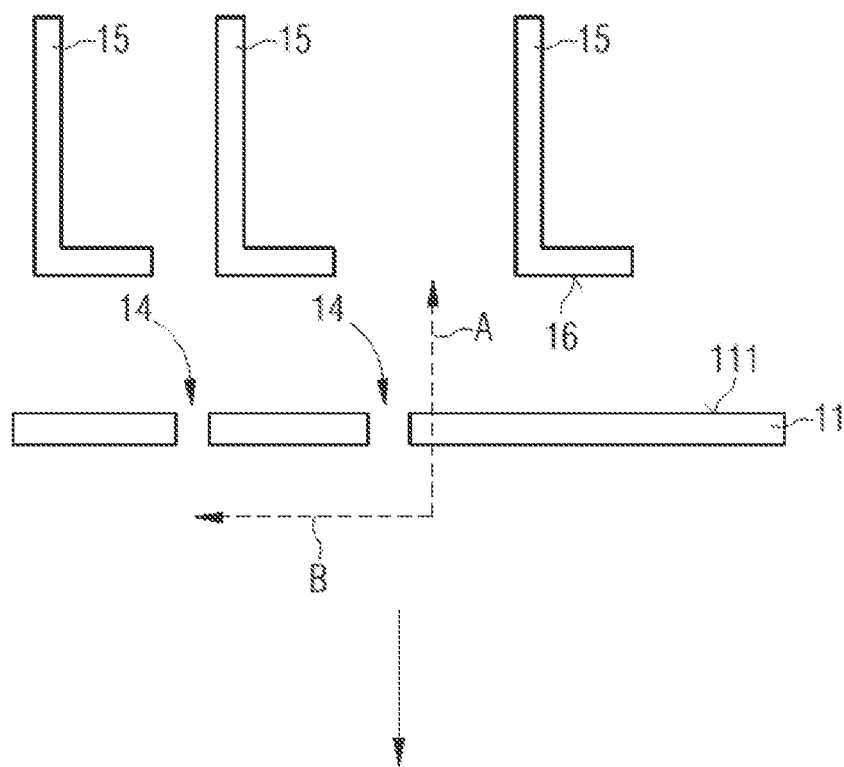
Figure 7:
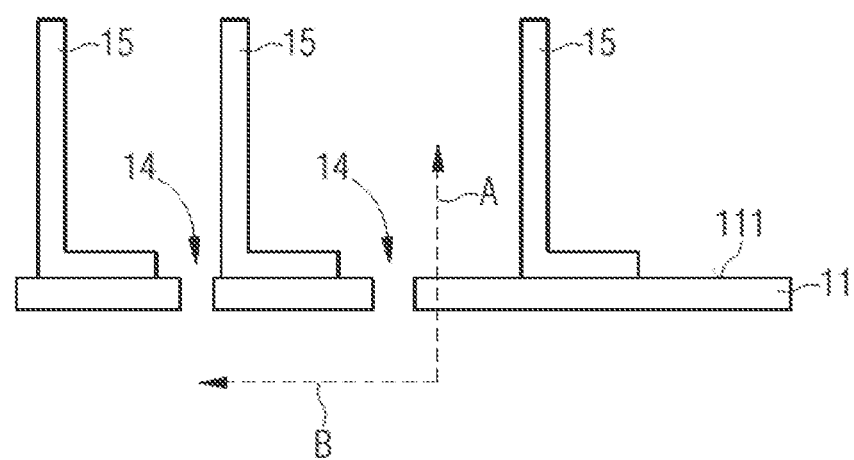

FIG. 7 illustrates an alternative step of providing the metal top layer 11 with predetermined penetrating recesses 14. The metal top layer 11 can be provided by means of stamping even before welding the terminals 15 to the metal top layer 11 (see upper part of FIG. 7). After welding the terminals 15 to the metal top layer 11 the manufacturing method can continue as illustrated in FIGS. 5 and 6.

Figure 8:
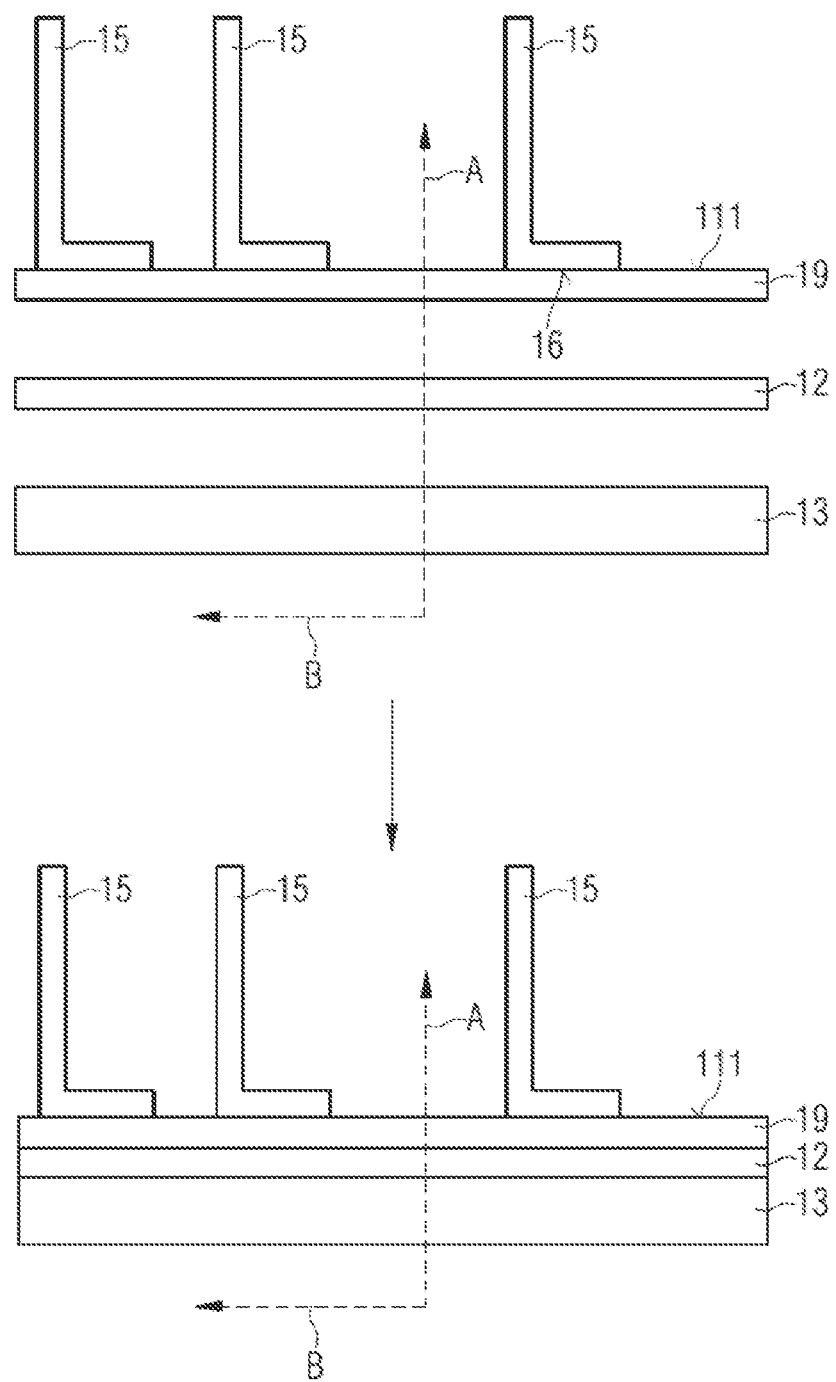
FIGS. 8-9 steps of manufacturing a further embodiment of the metal substrate structure for the semiconductor power module.
Figure 9:
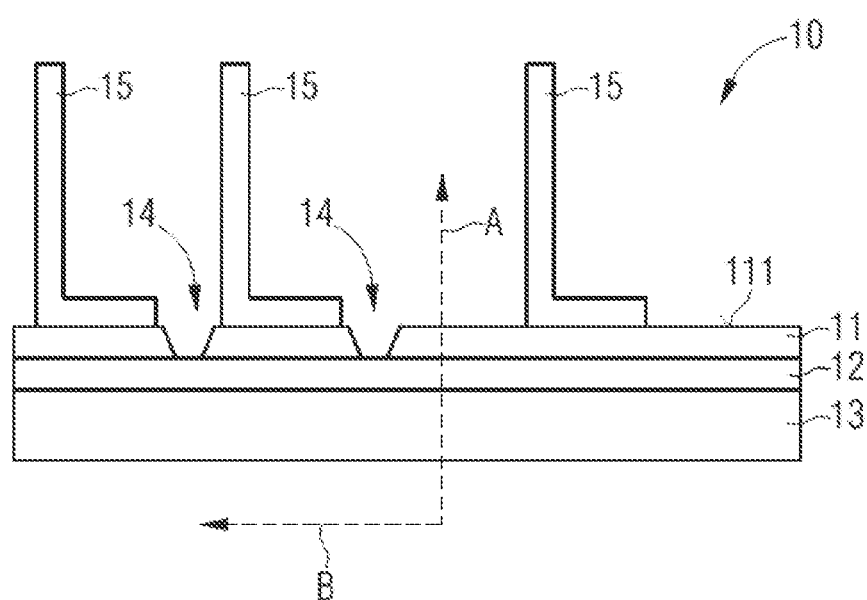

FIGS. 8 and 9 illustrate manufacturing states of a different method for manufacturing a further embodiment of the metal substrate structure 10. According to such an embodiment the metal substrate structure 10 can be formed by means of laminating, masking and etching.

In a step S1 a raw sheet 19 is provided to form the later metal top layer 11 and the terminals 15 are welded to the outer surface 111 (see upper part of FIG. 8). Moreover, the dielectric layer 12 is provided in form of a pre-preg material sheet, for example. Moreover, the metal bottom layer 13 is provided and the metal top layer 11, the dielectric layer 12 and the metal bottom layer 13 are aligned with respect to each other.

In a step S2 lamination is processed to couple the aforementioned layers 11, 12 and 13 together (see lower part of FIG. 8).

In a step S3 recesses 14 are formed in the metal top layer 11 due to masking and etching (see FIG. 9). Additionally, cleaning and/or levelling of the metal substrate structure 10 can be performed.

According to the described embodiments the terminals 15 are joined to the metal top layer 11 before the coupling of the layers 11, 12, 13 of the metal substrate structure 10 is finished. Here the manufacturing of the metal substrate structure can realize a process within the manufacturing to the semiconductor power module 1. In contrast to conventional manufacturing processes for insulated metal substrates and subsequent module assembly processes, main and auxiliary terminals 15 are welded to a bare copper top side metallization plate realizing the metal top layer 11 beforehand to the manufacturing of the remaining metal substrate structure 10 itself. Consequently, no isolating resin sheet, which realizes the dielectric layer 12, is present and experiences mechanical and thermal stress during welding processing. The welding can be done by ultrasonic welding, laser welding, or any other type of applicable welding process.

According to the illustrated process flows for the described possible setup types of the metal substrate structure 10, the welding process for the joining the terminals 15 is done before lamination or molding of the isolating material of the dielectric layer 12, respectively. With respect of manufacturing the metal substrate structure 10 by means of a lamination process a homogeneous copper top side plate with welded terminals 15, the pre-preg dielectric layer 12, and the bottom plate are coupled together. Circuit pattern are prepared by etching after the lamination process. Alternatively or additionally, a singulation of pattern can be done before lamination.

With respect of manufacturing the metal substrate structure 10 by means of a molding process of the isolating material of the dielectric layer 12, the pattern of the circuit metallization can be prepared by stamping, etching and/or cutting before the injection, transfer or compression molding process is performed. Alternatively or additionally, a singulation of pattern can be done before lamination. Nevertheless, further process steps may be integrated into the manufacturing method as well, like cleaning processes or levelling processes for a top plate being deformed after the welding process before assembling of the complete insulated metal substrate structure 10.

The terminals 15 can be made from copper or a copper alloy and can realize auxiliary or main terminals. A thickness of the terminals 15 can have a value of 0.2 mm up to 3.0 mm with respect to the lateral direction B and/or the stacking direction A. This may apply to both an upright body portion and/or a horizontal foot portion of the L-shaped terminal 15, respectively. Horizontal and vertical sections may have equal or different thicknesses.

Due to the described options of the manufacturing method it is possible to prevent a deformation of the comparably soft resin dielectric layer 12 due to thermal and mechanical impact even when performing ultrasonic welding on the circuit metallization of the metal top layer 11. This further contributes to avoid at least local delamination between resin sheet and metal parts and/or crack formation inside the isolating sheet of the dielectric layer. Delamination or crack formation may also cause partial discharge and dielectric breakdown in high voltage power modules. Thus, there is no deformation of the resin sheet or modifications of the resin of the dielectric layer 12 visible caused by mechanical and/or thermal impact under the welded terminal feet.

Accordingly, a corresponding design of the semiconductor power module 1 can comprise one or more of the following benefits: The proposed process flow circumvents the issue of possible damages on the mechanically and thermally sensitive resin isolating sheet of the dielectric layer 12 during the welding process. This opportunity makes the use of this comparably cost-effective substrate design interesting for large power modules and applicable for higher voltage classes, in view of novel joining methods like welding techniques (e.g. ultrasonic welding, laser welding) are used as well. Consequently, a significant cost-down may be possible, when replacing a conventional setup of substrates with ceramic isolating sheets soldered to a baseplate by an insulated metal substrate structure 10 according to the present disclosure. On one hand material costs may be reduced, and on the other hand several process steps like the joining process between the metal substrate structure 10 and a baseplate or cooler in the semiconductor power module 1 can be removed from a corresponding process flow.

By use of the described method for manufacturing a metal substrate structure it is possible to counteract the formation of cracks or damages due to the separated welding process wherein the terminals 15 are welded to circuit metallization of the metal top layer 11 before and space apart from the preparation of the insulated metal substrate structure 10 including the coupling of the metal top layer 11 and the dielectric layer 12. Thus, a risk of crack or damage formation is significantly reduced or even completely suppressed and a stable semiconductor power module 1 is feasible that enables reliable functioning even for high voltage power module applications in a voltage range of 0.5 kV up to 10.0 kV, for example.

The embodiments shown in FIGS. 1 to 10 as stated represent exemplary embodiments of the improved metal substrate structure 10, the semiconductor power module 1 and the manufacturing method for; therefore, they do not constitute a complete list of all embodiments. Actual arrangements and methods may vary from the embodiments shown in terms of metal substrate structures and power modules, for example.

The described method enables the manufacturing of embodiments of the aforementioned metal substrate structure and the semiconductor power module, described features and characteristics of the manufacturing method are also disclosed with respect to the metal substrate structure and the semiconductor power module and vice versa. Thus, the present disclosure comprises several aspects, wherein every feature described with respect to one of the aspects is also disclosed herein with respect to the other aspect, even if the respective feature is not explicitly mentioned in the context of the specific aspect.

What is claimed is:

1. A method for manufacturing a metal substrate structure for a semiconductor power module, the method comprising: welding a plurality of terminals to a metal top layer; and after the welding, coupling a dielectric layer between the metal top layer and a metal bottom layer.

2. The method according to claim 1, wherein coupling the dielectric layer between the metal top layer and the metal bottom layer comprises:
aligning the metal top layer, the dielectric layer and the metal bottom layer relative to each other; and
laminating the metal top layer, the dielectric layer and the metal bottom layer.

3. The method according to claim 1, further comprising masking and etching a recess in the metal top layer.

4. The method according to claim 1, further comprising stamping and/or cutting a recess in the metal top layer.

5. The method according to claim 4, wherein the terminals are welded to the metal top layer before stamping and/or cutting the metal top layer.

6. The method according to claim 4, wherein the terminals are welded to the metal top layer after stamping and/or cutting the metal top layer.

7. The method according to claim 1, wherein welding the terminals to the metal top layer comprises welding by ultrasonic welding.

8. The method according to claim 1, wherein welding the terminals to the metal top layer comprises welding by laser welding.

9. The method according to claim 1, further comprising cleaning and/or levelling the terminals, the metal top layer, the dielectric layer and/or the metal bottom layer.

10. A method of making a semiconductor power module, the method comprising electrically coupling electronics with the metal top layer of the metal substrate structure of claim 1.

11. The method of claim 10, wherein the semiconductor power module comprises:
the metal bottom layer;
the metal top layer, a plurality of pads being formed within the metal top layer;
the plurality of terminals; and
the dielectric layer disposed between the metal top layer and the metal bottom layer, the dielectric layer including a ditch located in a region between a first pad and a second pad and also including a rib located in a region between the second pad and a third pad, the ditch extending below a top surface of the metal top layer and the rib protruding above the top surface of the metal top layer; and
the electronics electrically coupled with the metal top layer.

12. The semiconductor power module according to claim 11, wherein each terminal has an L-shape including a first portion parallel to the respective pad and a second portion extending away from the respective pad, the second portion being longer than the first portion.

13. A method for manufacturing a metal substrate structure for a semiconductor power module, the method comprising:
welding a plurality of terminals to a metal top layer; and
after the welding, coupling a dielectric layer between the metal top layer and a metal bottom layer, wherein coupling the dielectric layer between the metal top layer and the metal bottom layer comprises:
providing a molding substance;
aligning the metal top layer and the metal bottom layer relative to each other with a predetermined distance in between; and bringing the molding substance between the aligned metal top layer and the metal bottom layer and thereby forming the dielectric layer by molding.

14. A method for manufacturing a metal substrate structure for a semiconductor power module, the method comprising:
   welding a plurality of terminals to a metal top layer;
   forming a plurality of pad regions within the metal top layer;
   after the welding, aligning the metal top layer with a metal bottom layer; and
   molding a dielectric material between the aligned metal top layer and metal bottom layer.

15. The method according to claim 14, wherein the pad regions are formed before welding the terminals to the metal top layer.

16. The method according to claim 14, wherein the pad regions are formed after welding the terminals to the metal top layer.

17. The method according to claim 14, wherein welding the terminals to the metal top layer comprises welding by ultrasonic welding or laser welding.

18. The method according to claim 14, further comprising cleaning and/or levelling the terminals, the metal top layer, the dielectric material and/or the metal bottom layer.

19. A method for manufacturing a metal substrate structure for a semiconductor power module, the method comprising:
   welding a plurality of terminals to a metal top layer; and
   after the welding, aligning the metal top layer with a dielectric layer and a metal bottom layer;
   laminating the metal top layer, the dielectric layer and the metal bottom layer; and
   etching portions of the metal top layer to form electrically isolated pads, each terminal being welded to a respective one of the pads.

20. The method according to claim 19, wherein welding the terminals to the metal top layer comprises welding by ultrasonic welding or laser welding.

21. The method according to claim 19, further comprising cleaning and/or levelling the terminals, the metal top layer, the dielectric layer and/or the metal bottom layer.

* * * * *